United States Patent
Jang et al.

(10) Patent No.: US 12,278,251 B2
(45) Date of Patent: Apr. 15, 2025

(54) IMAGE SENSOR

(71) Applicant: SAMSUNG ELECTRONICS CO., LTD., Suwon-si (KR)

(72) Inventors: Dongyoung Jang, Hwaseong-si (KR); Seokho Kim, Hwaseong-si (KR); Eungkyu Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 751 days.

(21) Appl. No.: 17/409,888

(22) Filed: Aug. 24, 2021

(65) Prior Publication Data

US 2022/0199670 A1   Jun. 23, 2022

(30) Foreign Application Priority Data

Dec. 17, 2020   (KR) .................. 10-2020-0177711

(51) Int. Cl.
*H01L 27/146* (2006.01)
*H01L 23/00* (2006.01)

(52) U.S. Cl.
CPC ........ *H01L 27/14634* (2013.01); *H01L 24/08* (2013.01); *H01L 27/14623* (2013.01); *H01L 27/14636* (2013.01); *H01L 2224/08145* (2013.01)

(58) Field of Classification Search
None
See application file for complete search history.

(56) References Cited

U.S. PATENT DOCUMENTS

| | | | |
|---|---|---|---|
| 8,669,602 B2 | 3/2014 | Hayashi | |
| 8,742,524 B2* | 6/2014 | Itonaga | H01L 23/552 |
| | | | 257/E23.141 |
| 8,792,034 B2 | 7/2014 | Takahashi | |
| 8,853,852 B2* | 10/2014 | Hayashi | H01L 27/14632 |
| | | | 257/E31.097 |
| 8,933,544 B2 | 1/2015 | Mao et al. | |
| 9,026,972 B2 | 5/2015 | Soda | |
| 9,391,112 B2* | 7/2016 | Shimotsusa | H01L 27/14636 |

(Continued)

FOREIGN PATENT DOCUMENTS

JP            6044847 B2    11/2016
KR   10-2020-0011414 A      2/2020
(Continued)

*Primary Examiner* — Nishath Yasmeen
(74) *Attorney, Agent, or Firm* — Muir Patent Law, PLLC

(57) ABSTRACT

An image sensor includes a sensor chip and a logic chip. The sensor chip includes a first substrate, an upper bonding layer, a first wiring layer, and the logic chip includes a second substrate, a lower bonding layer, a second wiring layer. The upper and lower bonding layers contact each other, with the upper bonding layer including an upper dielectric layer, an upper conductive pad, an upper shield structure, and an upper wiring line, and the lower bonding layer including a lower dielectric layer, a lower conductive pad, a lower shield structure, and a lower wiring line. The upper wiring line, upper conductive pad, and upper shield structure being one body, and the lower wiring line, lower conductive pad, and lower shield structure being one body, the upper and lower conductive pads overlap and contact each other, and the upper and lower wiring lines overlap and contact each other.

20 Claims, 17 Drawing Sheets

(56) References Cited

U.S. PATENT DOCUMENTS

| | | | |
|---|---|---|---|
| 2010/0238331 A1* | 9/2010 | Umebayashi | H04N 25/79 257/E31.097 |
| 2012/0062777 A1* | 3/2012 | Kobayashi | H01L 27/14623 348/E5.091 |
| 2012/0199930 A1* | 8/2012 | Hayashi | H01L 27/14634 257/E31.127 |
| 2013/0020468 A1* | 1/2013 | Mitsuhashi | H01L 27/14634 257/E21.585 |
| 2013/0105924 A1* | 5/2013 | Kobayashi | H01L 31/18 438/69 |
| 2014/0374865 A1 | 12/2014 | Kobayashi et al. | |
| 2017/0243819 A1 | 8/2017 | Kagawa et al. | |
| 2020/0185445 A1* | 6/2020 | Yamagishi | H01L 27/14636 |
| 2021/0391376 A1* | 12/2021 | Chen | H01L 23/5385 |
| 2022/0375983 A1* | 11/2022 | Kang | H01L 27/14636 |

FOREIGN PATENT DOCUMENTS

| | | |
|---|---|---|
| WO | WO 2013/115075 A1 | 8/2013 |
| WO | WO 2020/085113 A1 | 4/2020 |

* cited by examiner

IMAGE SENSOR

CROSS-REFERENCE TO RELATED APPLICATION

Korean Patent Application No. 10-2020-0177711, filed on Dec. 17, 2020, in the Korean Intellectual Property Office, and entitled: "Image Sensor," is incorporated by reference herein in its entirety.

BACKGROUND

1. Field

Embodiments relate to an image sensor.

2. Description of the Related Art

An image sensor is a semiconductor device to transforms optical images into electrical signals. Recent advances in computer and communication industries have led to strong demands in high performance image sensors in various consumer electronic device, e.g., digital cameras, camcorders, PCSs (Personal Communication Systems), game devices, security cameras, medical micro cameras, etc. An image sensor can be classified into a charge coupled device (CCD) type and a complementary metal oxide semiconductor (CMOS) type. A CMOS type image sensor is abbreviated to CIS (CMOS image sensor). The CIS may include a plurality of two-dimensionally arranged pixels, with each of the pixels including a photodiode that converts incident light into electrical signals.

SUMMARY

According to some embodiments, an image sensor may include a logic chip and a sensor chip which are sequentially stacked. The sensor chip may include a first substrate, an upper bonding layer below the first substrate, and a first wiring layer between the first substrate and the upper bonding layer. The logic chip may include a second substrate, a lower bonding layer on the second substrate, and a second wiring layer between the second substrate and the lower bonding layer. The upper bonding layer and the lower bonding layer may be in contact with each other. The upper bonding layer may include an upper dielectric layer, an upper conductive pad and an upper shield structure each of which penetrates the upper dielectric layer and which are spaced apart from each other, and an upper wiring line which penetrates the upper dielectric layer and connects the upper conductive pad to the upper shield structure. The lower bonding layer may include a lower dielectric layer, a lower conductive pad and a lower shield structure each of which penetrates the lower dielectric layer and which are spaced apart from each other, and a lower wiring line which penetrates the lower dielectric layer and connects the lower conductive pad to the lower shield structure. The upper wiring line, the upper conductive pad, and the upper shield structure may be integrally connected into a single body. The lower wiring line, the lower conductive pad, and the lower shield structure may be integrally connected into a single body. The upper conductive pad and the lower conductive pad may overlap and contact each other. The upper wiring line and the lower wiring line may overlap and contact each other.

According to some embodiments, an image sensor may include a logic chip and a sensor chip which are sequentially stacked. The sensor chip may include a first substrate, an upper bonding layer below the first substrate, and a first wiring layer between the first substrate and the upper bonding layer. The logic chip may include a second substrate, a lower bonding layer on the second substrate, and a second wiring layer between the second substrate and the lower bonding layer. The upper bonding layer and the lower bonding layer may be in contact with each other. The upper bonding layer may include an upper dielectric layer, and also include a pair of upper conductive pads, an upper shield structure, and an upper wiring line each of which penetrates the upper dielectric layer. The lower bonding layer may include a lower dielectric layer, and also include a pair of lower conductive pads, a lower shield structure, and a lower wiring line each of which penetrates the lower dielectric layer. The upper wiring line may lie between and integrally connect the pair of upper conductive pads. The lower wiring line may lie between and integrally connect the pair of lower conductive pads. The first substrate may include: a pixel array area; and an optical black area which surrounds the pixel array area. The upper shield structure and the lower shield structure may overlap the pixel array area. The pair of upper conductive pads, the upper wiring line, the pair of lower conductive pads, the lower shield structure, and the lower wiring line may overlap the optical black area. Each of the pair of upper conductive pads may overlap and contact a corresponding one of the pair of lower conductive pads. The upper wiring line may overlap and contact the lower wiring line.

According to some embodiments, an image sensor may include a logic chip and a sensor chip which are sequentially stacked. The sensor chip may include a first substrate, an upper bonding layer below the first substrate, a first wiring layer between the first substrate and the upper bonding layer, a connection structure which penetrates the first substrate and penetrates at least a portion of the first wiring layer, and an external coupling pad on the connection structure. The logic chip may include a second substrate, a lower bonding layer on the second substrate, and a second wiring layer between the second substrate and the lower bonding layer. The first wiring layer may include an interlayer dielectric layer and a wiring structure in the interlayer dielectric layer, the wiring structure being in contact with the connection structure. The upper bonding layer and the lower bonding layer may be in contact with each other. The upper bonding layer may include an upper dielectric layer, and also include a first upper conductive pad, a pair of second upper conductive pads, an upper shield structure, a first upper wiring line, and a second upper wiring line each of which penetrates the upper dielectric layer. The lower bonding layer may include a lower dielectric layer, and also include a first lower conductive pad, a pair of second lower conductive pads, a lower shield structure, a first lower wiring line, and a second lower wiring line each of which penetrates the lower dielectric layer. The first upper wiring line may lie between and integrally connect the first upper conductive pad and the upper shield structure. The second upper wiring line may lie between and integrally connect the pair of second upper conductive pads. The first lower wiring line may lie between and integrally connect the first lower conductive pad and the lower shield structure. The second lower wiring line may lie between and integrally connect the pair of second lower conductive pads. The wiring structure may be in contact with the first upper conductive pad. The first upper conductive pad and the first lower conductive pad may overlap and contact each other. The pair of second upper conductive pads and the pair of second lower conductive pads may correspondingly overlap and contact each other. The first upper wiring line and the first lower wiring line may overlap and contact each other. The second upper wiring line and the second lower wiring line may overlap and contact each other. The upper shield structure and the lower shield structure may be in contact with each other.

BRIEF DESCRIPTION OF THE DRAWINGS

Features will become apparent to those of skill in the art by describing in detail exemplary embodiments with reference to the attached drawings.

DETAILED DESCRIPTION

Figure 1:
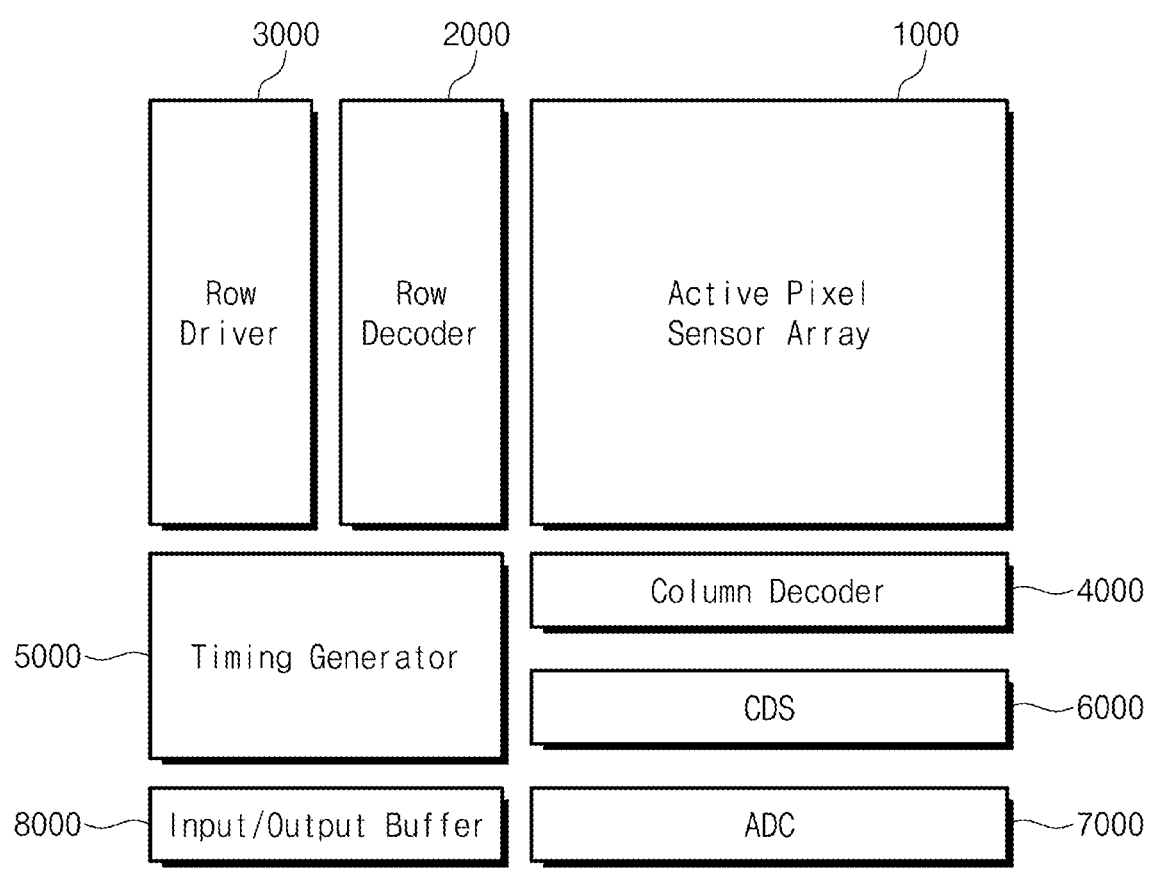
FIG. 1 illustrates a simplified block diagram of an image sensor according to some embodiments.

FIG. 1 illustrates a simplified block diagram of an image sensor according to some embodiments.

Referring to FIG. 1, an image sensor may include an active pixel sensor array 1000, a row decoder 2000, a row driver 3000, a column decoder 4000, a timing generator 5000, a correlated double sampler (CDS) 6000, an analog-to-digital converter (ADC) 7000, and an input/output (I/O) buffer 8000.

The active pixel sensor array 1000 may include a plurality of two-dimensionally arranged pixels, and each of the pixels may be configured to convert optical signals into electrical signals. The active pixel sensor array 1000 may be driven by a plurality of driving signals, e.g., a pixel selection signal, a reset signal, and a charge transfer signal, from the row driver 3000. In addition, the CDS 6000 may be provided with the electrical signals which are converted by the active pixel sensor array 1000.

The row driver 3000 may provide the active pixel sensor array 1000 with several driving signals for driving several unit pixels in accordance with a decoded result obtained from the row decoder 2000. When the unit pixels are arranged in a matrix shape, the driving signals may be provided for respective rows.

The timing generator 5000 may provide timing and control signals to the row decoder 2000 and the column decoder 4000.

The CDS 6000 may receive the electrical signals generated from the active pixel sensor array 1000, and may hold and sample the received electrical signals. The CDS 6000 may perform a double sampling operation to sample a specific noise level and a signal level of the electrical signal, and then output a difference level corresponding to a difference between the noise and signal levels.

The ADC 7000 may convert analog signals, which correspond to the difference level received from the CDS 6000, into digital signals, and may then output the converted digital signals.

The input/output buffer 8000 may latch the digital signals and then sequentially output the latched digital signals to an image signal processing unit in response to the decoded result obtained from the column decoder 4000.

Figure 2:
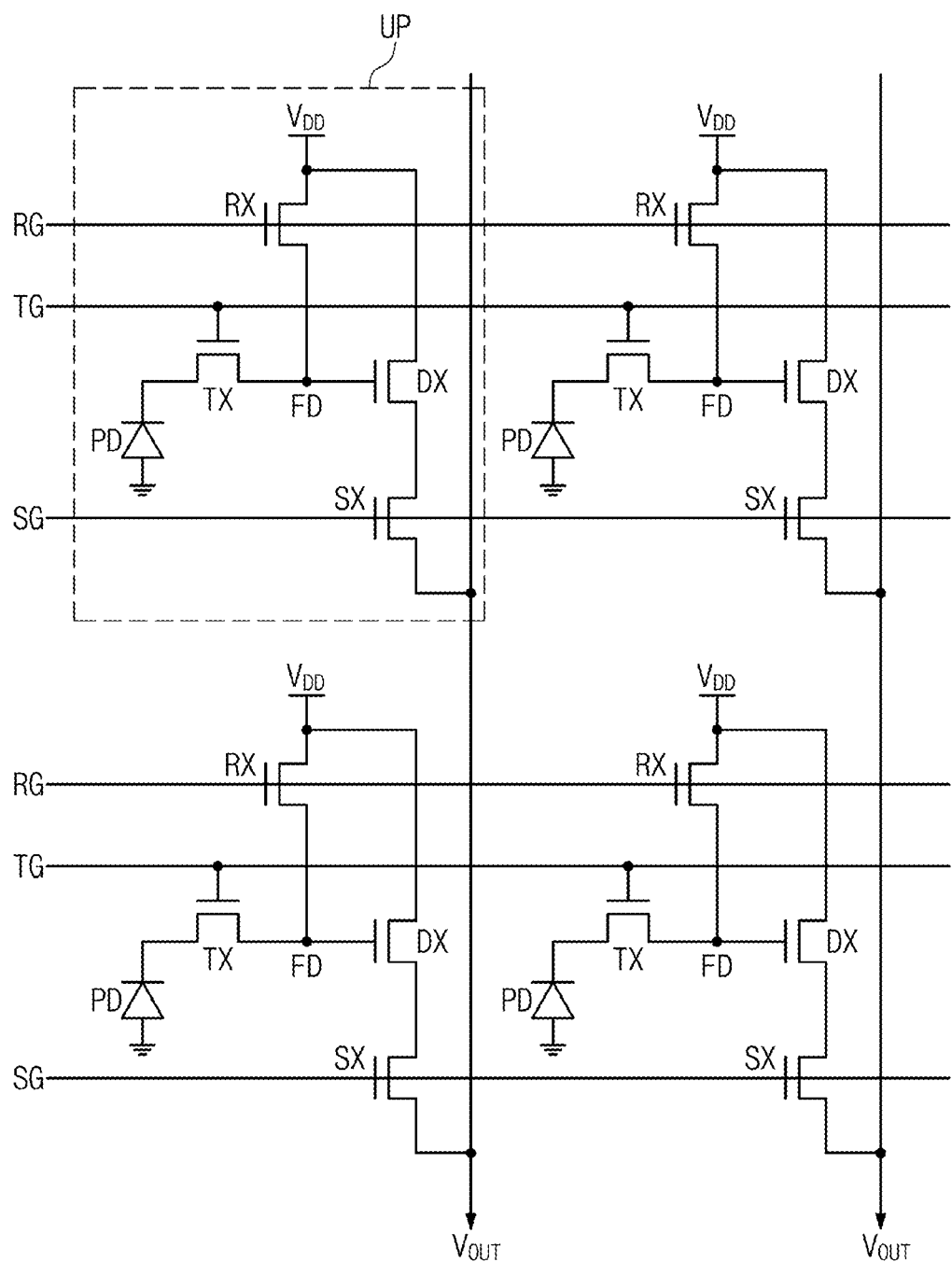
FIG. 2 illustrates a circuit diagram of an active pixel sensor array of an image sensor according to some embodiments.

FIG. 2 illustrates a circuit diagram of the active pixel sensor array 1000 in FIG. 1.

Referring to FIGS. 1 and 2, the active pixel sensor array 1000 may include a plurality of unit pixels UP, and the unit pixels UP may be arranged in a matrix shape. Each of the unit pixels UP may include a transfer transistor TX and logic transistors RX, SX, and DX. The logic transistors RX, SX, and DX may include a reset transistor RX, a selection transistor SX, and a drive transistor DX. The transfer transistor TX, the reset transistor RX, and the selection transistor SX may respectively include a transfer gate electrode TG, a reset gate electrode RG, and a selection gate electrode SG. Each of the unit pixels UP may further include a photoelectric conversion element PD and a floating diffusion region FD.

The photoelectric conversion element PD may create and accumulate photo-charges in proportion to an amount of external incident light. The photoelectric conversion element PD may be a photodiode that includes a P-type impurity region and an N-type impurity region. The transfer transistor TX may transfer charges generated in the photoelectric conversion element PD into the floating diffusion region FD. The floating diffusion region FD may accumulate and store charges that are generated and transferred from the photoelectric conversion element PD. The drive transistor DX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage $V_{DD}$. When the reset transistor RX is turned on, the floating diffusion region FD may be supplied with the power voltage $V_{DD}$ connected to the source electrode of the reset transistor RX. Accordingly, when the reset transistor RX is turned on, the charges accumulated in the floating diffusion region FD may be exhausted and thus the floating diffusion region FD may be reset.

The drive transistor DX may serve as a source follower buffer amplifier. The drive transistor DX may amplify a variation in electrical potential of the floating diffusion region FD and may output the amplified electrical potential to an output line $V_{OUT}$.

The selection transistor SX may select each row of the unit pixel UP to be readout. When the selection transistor SX is turned on, the power voltage $V_{DD}$ may be applied to a drain electrode of the drive transistor DX.

FIG. 2 depicts by way of example a unit pixel UP that includes one photoelectric conversion element PD and four transistors TX, RX, DX, and SX, but the image senor according to embodiments is not limited thereto. For example, neighboring unit pixels UP may share one of the reset transistor RX, the drive transistor DX, and the selection transistor SX. Therefore, the image sensor may increase in integration.

Figure 3A:
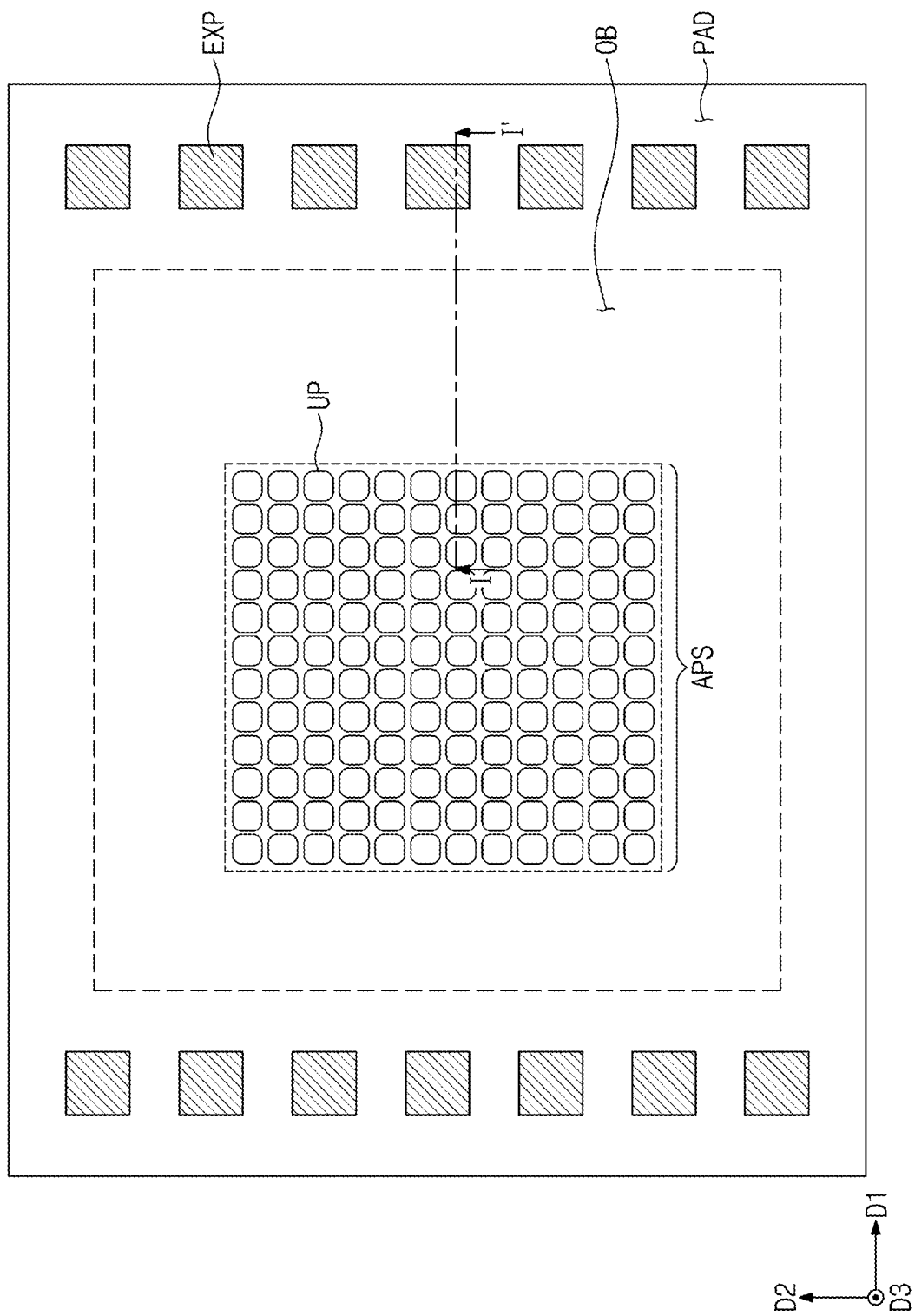
FIG. 3A illustrates a top view of an image sensor according to some embodiments.
Figure 3B:
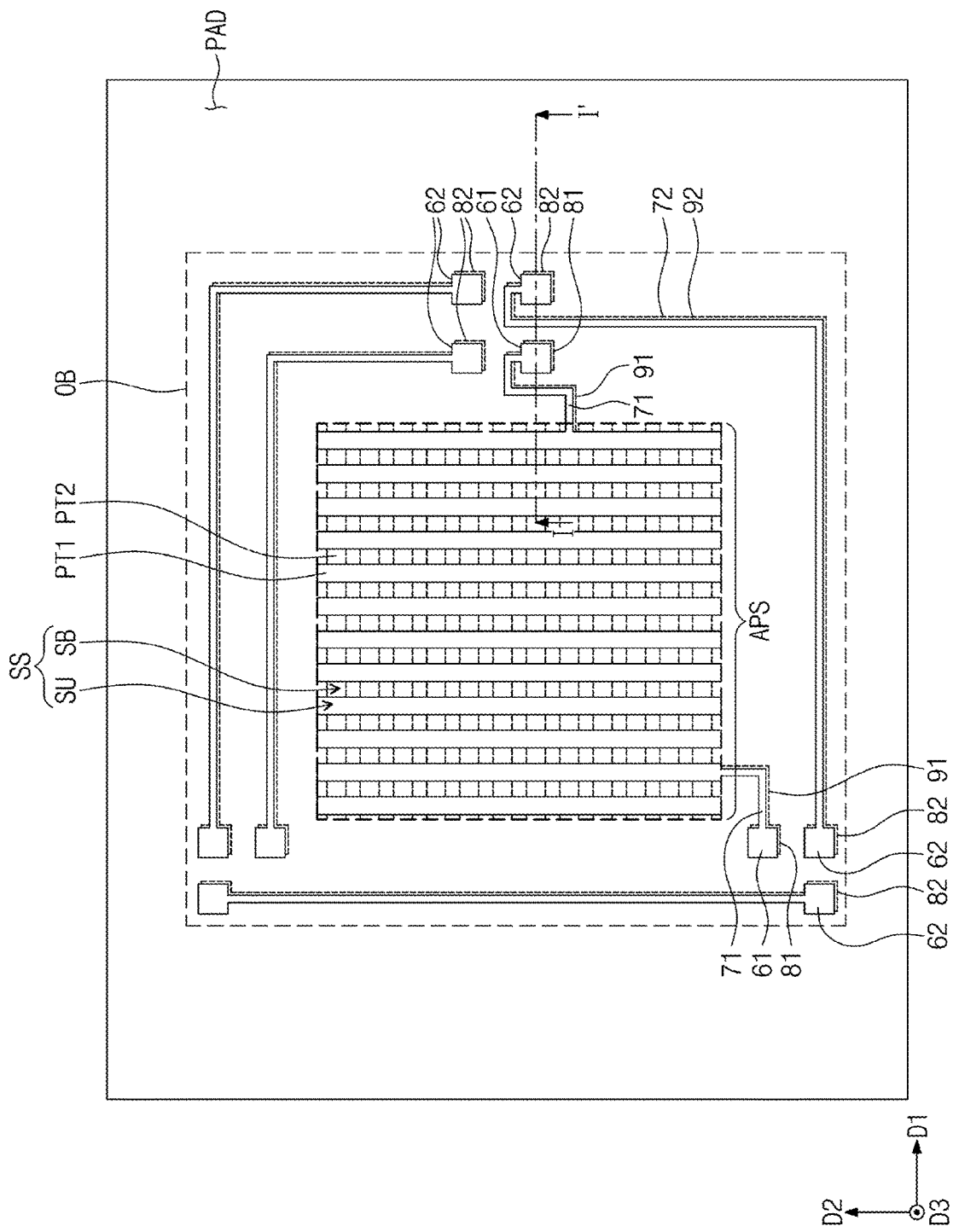
FIG. 3B illustrates a plan view of conductive pads, wiring lines, and shield structures according to some embodiments.
Figure 3C:
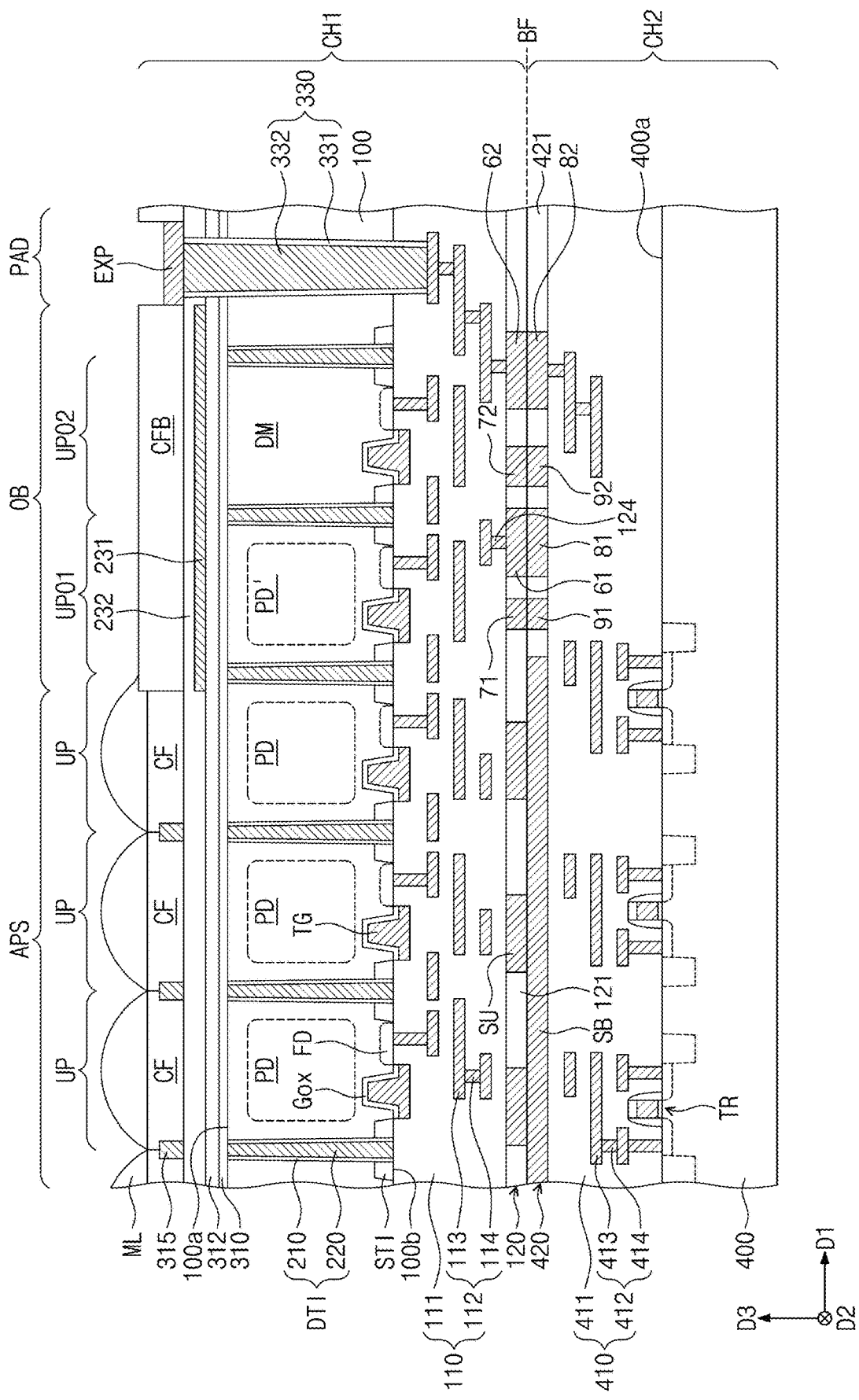
FIG. 3C illustrates a cross-sectional view along line I-I' of FIG. 3A or 3B.

FIG. 3A illustrates a top view showing an image sensor according to some embodiments. FIG. 3B illustrates a plan view of conductive pads and shield structures that correspond to FIG. 3A. FIG. 3C illustrates a cross-sectional view along line I-I' of FIG. 3A or 3B.

Referring to FIGS. 3A, 3B, and 3C, an image sensor according to embodiments may have a structure in which a first sub-chip CH1 is bonded to a second sub-chip CH2. The first sub-chip CH1 may have, e.g., an image sensing function. The second sub-chip CH2 may include circuits that drive the first sub-chip CH1 or store electrical signals generated from the first sub-chip CH1.

The first sub-chip CH1 may include a first substrate 100 including a pixel array area APS, an optical black area OB, and a pad area PAD.

The first substrate 100 may be a semiconductor substrate (e.g., a silicon substrate, a germanium substrate, a silicon-germanium substrate, a II-VI group compound semiconductor substrate, or a III-V group compound semiconductor substrate) or a silicon-on-insulator (SOI) substrate. The first substrate 100 may have a first surface 100a and a second surface 100b that are opposite to each other.

The pixel array area APS may include a plurality of unit pixels UP and a deep trench isolation DTI disposed in the first substrate 100 between the plurality of unit pixels UP. As shown in FIG. 3A, the plurality of unit pixels UP may be two-dimensionally arranged along a first direction D1 and a second direction D2 that are parallel to the first surface 100a of the first substrate 100. The first and second directions D1 and D2 may intersect each other.

When viewed in a plan view, the deep trench isolation DTI may have a grid structure that surrounds each of the plurality of unit pixels UP, e.g., a grid structure separating the matrix of unit pixels UP in FIG. 3A from each other. As illustrated in FIG. 3C, the deep trench isolation DTI may penetrate at least a portion of the first substrate 100 in a third direction D3 perpendicular to the second surface 100b of the first substrate 100. According to some embodiments, the deep trench isolation DTI may extend from the first surface 100a toward the second surface 100b of the first substrate 100, and may have a bottom surface substantially coplanar with the second surface 100b of the first substrate 100. The deep trench isolation DTI may penetrate a shallow trench isolation STI, which will be discussed below, and may extend into the first substrate 100. The deep trench isolation DTI1 may prevent a crosstalk between neighboring unit pixels UP.

The deep trench isolation DTI may include a first isolation pattern 210 and a second isolation pattern 220. The first isolation pattern 210 may include one or more of a silicon-based dielectric material (e.g., silicon nitride, silicon oxide, and/or silicon oxynitride) and a high-k dielectric material (e.g., hafnium oxide and/or aluminum oxide). Alternatively, the first isolation pattern 210 may include a plurality of layers having different materials from each other. The first isolation pattern 210 may have a refractive index less than that of the first substrate 100.

The second isolation pattern 220 may be provided in the first isolation pattern 210, e.g., the first isolation pattern 210 may surround sidewalls of the second isolation pattern 220. The first isolation pattern 210 may be interposed between the second isolation pattern 220 and the first substrate 100. The first isolation pattern 210 may, e.g., completely, separate the second isolation pattern 220 from the first substrate 100. Therefore, when the image sensor operates, the second isolation pattern 220 may be electrically separated from the first substrate 100. The second isolation pattern 220 may include a crystalline semiconductor material, e.g., polysilicon. For example, the second isolation pattern 220 may further include dopants having first conductivity type impurities or second conductivity type impurities. For example, the second isolation pattern 220 may include doped polysilicon.

The shallow trench isolation STI may be disposed adjacent to the second surface 100b of the first substrate 100. The shallow trench isolation STI may extend into the first substrate 100 from the second surface 100b of the first substrate 100. The shallow trench isolation STI may include at least one of, e.g., a silicon oxide layer, a silicon nitride layer, and a silicon oxynitride layer.

Each of the plurality of unit pixels UP may include a photoelectric conversion region PD and a doping region that extends along a lateral surface of the deep trench isolation DTI. In the description below, the photoelectric conversion region PD may indicate an area including the photoelectric conversion element PD of FIGS. 1 and 2. The doping region may be disposed between the photoelectric conversion region PD and the deep trench isolation DTI, e.g., between the dashed frame and a sidewall of the deep trench isolation DTI.

A transfer gate electrode TG may be disposed on the second surface 100b of the first substrate 100. The transfer gate electrode TG may serve as a gate electrode of the transfer transistor TX discussed above with reference to FIG. 2. The transfer gate electrode TG may be a vertical type that protrudes into the first substrate 100. Alternatively, the transfer gate electrode TG may be a planar type that does not protrudes into the first substrate 100 and has a flat bottom surface. The transfer gate electrode TG may include, e.g., one or more of a metallic material, metal silicide, polysilicon, and a combination thereof. In this case, the polysilicon may include doped polysilicon. Although not shown in FIG. 3C, the unit pixel UP may be configured such that the first substrate 100 may be provided on its second surface 100b with gate electrodes of the reset, drive, and selection transistors RX, DX, and SX described above with reference to FIG. 2.

A gate dielectric pattern Gox may be interposed between the transfer gate electrode TG and the first substrate 100. The gate dielectric pattern Gox may include, e.g., one or more of a silicon-based dielectric material (e.g., silicon nitride, silicon oxide, and/or silicon oxynitride) and a high-k dielectric material (e.g., hafnium oxide and/or aluminum oxide).

A first wiring layer 110 may be disposed on the second surface 100b of the first substrate 100. The first wiring layer 110 may include a first interlayer dielectric layer 111 stacked on the second surface 100b of the first substrate 100, and may also include a first wiring structure 112 disposed in the first interlayer dielectric layer 111. The first wiring structure 112 may include first wiring lines 113 and first vias 114.

The first interlayer dielectric layer 111 may include a plurality of dielectric layers. Each of the plurality of dielectric layers may include, e.g., one or more of silicon oxide ($SiO_2$) and silicon nitride (SiN).

An upper bonding layer 120 may be provided on the first interlayer dielectric layer 111. The upper bonding layer 120 may include a first dielectric layer 121, and may also include a first upper conductive pad 61, a second upper conductive pad 62, a first upper wiring line 71, a second upper wiring line 72, and an upper shield structure SU, each including, for example, copper. The first dielectric layer 121 may include, e.g., silicon oxide ($SiO_2$). The upper bonding layer 120 may be bonded to a lower bonding layer 420 of the second sub-chip CH2 which will be discussed below.

The first upper conductive pad 61, the second upper conductive pad 62, the first upper wiring line 71, and the second upper wiring line 72 may be disposed to overlap the optical black area OB. The upper shied structure SU may be provided to overlap the pixel array area APS.

As shown in FIG. 3C, a first pad via 124 may be provided between the first upper conductive pad 61 and one of lowermost ones of the first wiring lines 113, and between the second upper conductive pad 62 and another of lowermost ones of the first wiring lines 113. The first pad via 124 may be in contact with the first and second upper conductive pads 61 and 62. The upper shield structure SU may be in no contact with the first pad via 124.

The first and second upper conductive pads 61 and 62 may have their bottom surfaces that are exposed from the first dielectric layer 121, and may also have their top and lateral surfaces that are not exposed from the first dielectric layer 121. The first and second upper conductive pads 61 and 62 may each have, e.g., a square pillar shape, a cylindrical shape, or any suitable shape. The upper shield structure SU and the first and second upper wiring lines 71 and 72 may have their bottom surfaces that are exposed from the first dielectric layer 121, and may also have their top and lateral surfaces that are not exposed from the first dielectric layer 121.

The following will further discuss other features of the first and second upper conductive pads 61 and 62, the first and second upper wiring lines 71 and 72, and the upper shield structure SU.

An antireflection layer 310 may be disposed on the first surface 100a of the first substrate 100. The antireflection layer 310 may conformally cover the first surface 100a of the first substrate 100. The antireflection layer 310 may prevent light reflection such that the photoelectric conversion region PD may be allowed to readily receive light that is incident onto the first surface 100a of the first substrate 100. The antireflection layer 310 may include, e.g., silicon nitride. Although not shown, a negative fixed charge layer may be interposed between the antireflection layer 310 and the first surface 100a of the first substrate 100. The fixed charge layer may be in contact with the first surface 100a of the first substrate 100. The fixed charge layer may include, e.g., metal oxide and metal fluoride. The metal oxide may be hafnium oxide or aluminum oxide.

A third interlayer dielectric layer 312 may be disposed on the antireflection layer 310. The third interlayer dielectric layer 312 may conformally cover a top surface of the antireflection layer 310. The third interlayer dielectric layer 312 may be interposed between the antireflection layer 310 and color filters CF which will be discussed below. The third interlayer dielectric layer 312 may include one or more of metal oxide and nitride. For example, the metal oxide may include aluminum oxide, and the nitride may include silicon nitride.

A plurality of color filters CF may be disposed on the antireflection layer 310. The plurality of color filters CF may be disposed to overlap vertically (e.g., in the third direction D3) with corresponding photoelectric conversion regions PD of the unit pixels UP. The color filter CF may include one of red, green, and blue color filters depending on a unit pixel UP. The color filters CF may be arranged two-dimensionally, and may include a yellow filter, a magenta filter, and a cyan filter.

A plurality of micro-lenses ML may be disposed on the plurality of color filters CF. The plurality of micro-lenses ML may be disposed to overlap vertically (e.g., in the third direction D3) with corresponding photoelectric conversion regions PD of the unit pixels UP. Each of the micro-lenses ML may have a convex shape to focus light that is incident onto the unit pixel UP.

A grid pattern 315 may be interposed between the third interlayer dielectric layer 312 and the color filters CF. The grid pattern 315 may be disposed to vertically overlap the deep trench isolation DTI. The grid pattern 315 may allow the photoelectric conversion region PD to receive light that is incident onto the first surface 100a of the first substrate 100. The grid pattern 315 may include, e.g., metal. The color filters CF may extend between neighboring grid patterns 315 and may contact the third interlayer dielectric layer 312.

The optical black area OB may include a first black pixel UPO1 and a second black pixel UPO2. On the first black pixel UPO1, an additional photoelectric conversion region PD' may be disposed in the first substrate 100. On the second black pixel UPO2, a dummy region DM may be provided in the first substrate 100.

The additional photoelectric conversion region PD' may be an area doped with second conductivity type impurities (e.g., N-type impurities) different from first conductivity impurities of the first substrate 100. The additional photoelectric conversion region PD' may have a structure similar to that of the photoelectric conversion regions PD in the plurality of unit pixels UP on the pixel array area APS, but may not perform the same operation (e.g., may not perform reception of light and generation of electrical signals) as that of the photoelectric conversion regions PD. The dummy region DM may not be doped with impurities.

On the optical black area OB, a first light-shield layer 231 may be provided on the third interlayer dielectric layer 312. The first light-shield layer 231 may block light that is incident onto the optical black area OB. The first light-shield layer 231 may include metal, e.g., copper, tungsten, aluminum, titanium, tantalum, or any alloy thereof.

On the optical black area OB and the pad area PAD, a planarized layer 232 may be provided to cover the third interlayer dielectric layer 312. The planarized layer 232 may cover the first light-shield layer 231. On the optical black area OB, a second light-shield layer CFB may be disposed on the planarized layer 232. The second light-shield layer CFB may include the same material as that of the blue color filter among the color filters CF.

On the pad area PAD, a connection structure 330 may be provided to penetrate the planarized layer 232, the third interlayer dielectric layer 312, the antireflection layer 310, the first substrate 100, and at least a portion of the first wiring layer 110. The connection structure 330 may include a through via 332 and a via dielectric layer 331 that surrounds the through via 332. The through via 332 may include a metallic material, e.g., tungsten. The via dielectric layer 331 may include, e.g., silicon oxide. The through via 332 may be electrically connected to the first wiring structure 112 of the first wiring layer 110. According to some embodiments, the connection structure 330 may downwardly extend to penetrate the upper bonding layer 120, and to further penetrate a lower bonding layer 420 and a second interlayer dielectric layer 411, which will be discussed below, to come into contact with a portion of a second wiring structure 412, which will be discussed below.

An external coupling pad EXP may be provided on the connection structure 330. The external coupling pad EXP may be supplied with voltage from the outside through, e.g., a bonding wire. The external coupling pad EXP may include metal, e.g., copper, aluminum, or an alloy thereof.

The external coupling pad EXP may receive voltage from the outside and provide the upper shield structure SU with voltage through the connection structure 330, the first wiring structure 112, the first upper conductive pad 61, the first pad via 124, and the first upper wiring line 71.

The second sub-chip CH2 may include a second substrate 400, a second wiring layer 410, and a lower bonding layer 420.

The second substrate 400 may include a semiconductor substrate. The second substrate 400 may have integrated circuits TR disposed on a top surface 400a thereof. In some embodiments, the integrated circuits TR may be disposed in the second substrate 400. The integrated circuits TR may include, e.g., logic circuits, memory circuits, or any combination thereof. The integrated circuits TR may include, e.g., transistors.

The second wiring layer 410 may be provided between the second substrate 400 and the upper bonding layer 120. The second wiring layer 410 may include a second interlayer dielectric layer 411 and a second wiring structure 412 disposed in the second interlayer dielectric layer 411. The second wiring structure 412 may include second wiring lines 413 and second vias 414.

The second interlayer dielectric layer 411 may include a plurality of dielectric layers. Each of the plurality of second interlayer dielectric layers may include one or more of silicon oxide (SiO$_2$) and silicon nitride (SiN). The lower bonding layer 420 may be provided between the second interlayer dielectric layer 411 and the upper bonding layer 120.

The upper and lower bonding layers 120 and 420 may be bonded to each other. The upper and lower bonding layers 120 and 420 may be bonded to form a bonding interface BF. The lower bonding layer 420 may include a second dielectric layer 421, and may also include a first lower conductive pad 81, a second lower conductive pad 82, a first lower wiring line 91, a second lower wiring line 92, and a lower shield structure SB, each including, for example, copper. The second dielectric layer 421 may include, e.g., silicon oxide (SiO$_2$).

The first and second lower conductive pads 81 and 82 may have their top surfaces that are exposed from the second dielectric layer 421, and may also have their bottom and lateral surfaces that are not exposed from the second dielectric layer 421. The first and second lower conductive pads 81 and 82 may have substantially the same shape as the first and second upper conductive pads 61 and 62, respectively. For example, as illustrated in FIGS. 3B and 3C, the first lower conductive pads 81 and the first upper conductive pads 61 may be directly on top of each other and completely overlap each other, and the second lower conductive pads 82 and the second upper conductive pads 62 may be directly on top of each other and completely overlap each other. The lower shield structure SB and the first and second lower wiring lines 91 and 92 may have their top surfaces that are exposed from the second dielectric layer 421, and may also have their bottom and lateral surfaces that are not exposed from the second dielectric layer 421. The first and second lower wiring lines 91 and 92 may have substantially the same shape as the first and second upper wiring lines 71 and 72, respectively. For example, as illustrated in FIGS. 3B and 3C, the first lower wiring lines 91 and the first upper wiring lines 71 may be directly on top of each other and completely overlap each other, and the second lower wiring lines 92 and the second upper wiring lines 72 may be directly on top of each other and completely overlap each other.

The following will further discuss other features of the first and second lower conductive pads 81 and 82, the first and second lower wiring lines 91 and 92, and the lower shield structure SB.

Figure 3D:
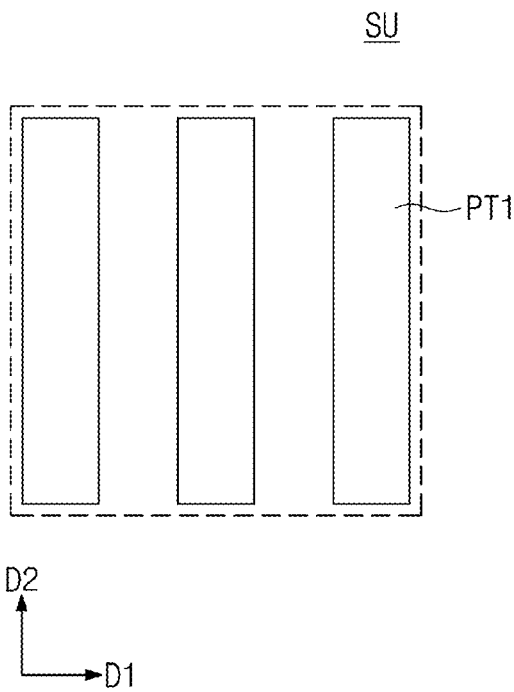
FIGS. 3D, 3E, and 3F illustrate simplified plan views respectively showing an upper shield structure, a lower shield structure, and a hybrid shield structure of FIG. 3B.
Figure 3E:
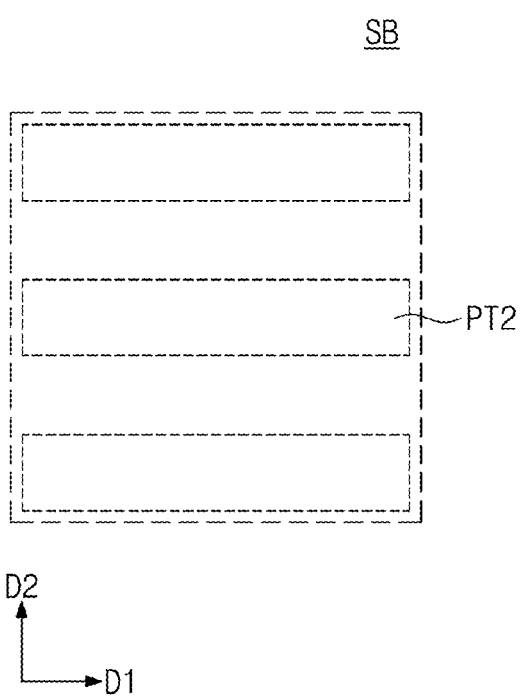
Figure 3F:
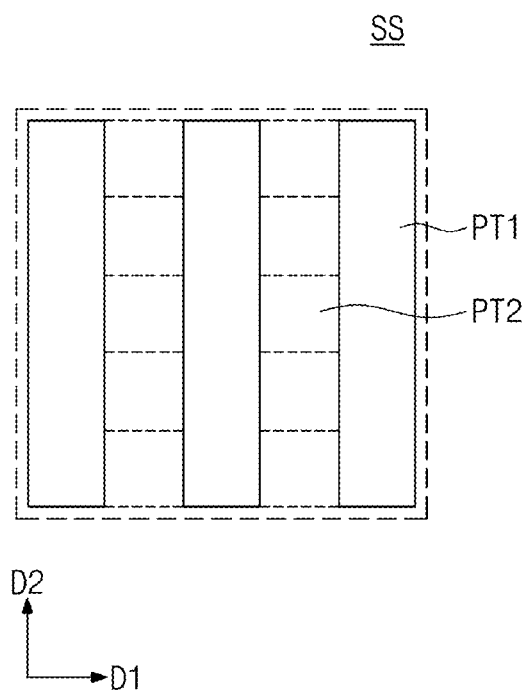

FIGS. 3D, 3E, and 3F illustrate simplified plan views respectively showing the upper shield structure SU, the lower shield structure SB, and a hybrid shield structure of FIG. 3B.

Referring to FIGS. 3B, 3C, and 3D, the upper shield structure SU may include first patterns PT1. The first patterns PT1 may have linear shapes that extend in the second direction D2 and may be spaced apart from each other along the first direction D1. For example, as illustrated in FIG. 3B, each of the first patterns PT1 may extend continuously in the second direction D2 along the entire pixel array area APS.

Referring to FIGS. 3B, 3C, and 3E, the lower shield structure SB may include second patterns PT2. The second patterns PT2 may have linear shapes that extend in the first direction D1 and may be spaced apart from each other along the second direction D2. For example, as illustrated in FIG. 3B, each of the second patterns PT2 may extend continuously in the first direction D1 along the, e.g., entire, pixel array area APS.

Referring to FIGS. 3B, 3C, and 3F, a hybrid shield structure SS may include the upper shield structure SU and the lower shield structure SB, e.g., the hybrid shield structure SS may be a combined structure of the upper shield structure SU and the lower shield structure SB together. The hybrid shield structure SS may have a lattice shape, when viewed in a plan view. That is, when viewed in a plan view, the first patterns PT1 may intersect the second patterns PT2 to have a lattice, e.g., grid, shape. The upper shield structure SU may, e.g., directly, contact the lower shield structure SB, as illustrated in FIG. 3C.

As shown in FIG. 3C, the upper shield structure SU may be located at the same level as that of the first and second upper conductive pads 61 and 62. For example, upper surfaces of the upper shield structure SU may be level with upper surfaces of the first and second upper conductive pads 61 and 62, and lower surfaces of the upper shield structure SU may be level with lower surfaces of the first and second upper conductive pads 61 and 62. Further, as shown in FIG. 3C, the lower shield structure SB may be located at the same level as that of the first and second lower conductive pads 81 and 82. For example, upper surfaces of the lower shield structure SB may be level with upper surfaces of the first and second lower conductive pads 81 and 82, and lower surfaces of the lower shield structure SB may be level with lower surfaces of the first and second lower conductive pads 81 and 82.

As shown in FIG. 3B, the upper shield structure SU may be connected through the first upper wiring line 71 to the first upper conductive pad 61. The upper shield structure SU, the first upper conductive pad 61, and the first upper wiring line 71 may be integrally formed, e.g., seamlessly of a same material, into a single body. The lower shield structure SB may be connected through the first lower wiring line 91 to the first lower conductive pad 81. The lower shield structure SB, the first lower conductive pad 81, and the first lower wiring line 91 may be integrally formed, e.g., seamlessly of a same material, into a single body.

The upper and lower shield structures SU and SB may be supplied with the same voltage. When the upper and lower shield structures SU and SB are in contact with each other, one or both of the upper and lower shield structures SU and SB may be supplied with voltage. For example, the voltage may be applied to only one or both of the upper and lower shield structures SU and SB. The voltage may be a positive voltage, a negative voltage, or a ground voltage.

According to embodiments, because the upper and lower shield structures SU and SB are supplied with voltage, the upper and lower shield structures SU and SB may shield electromagnetic waves between the first and second sub-chips CH1 and CH2. Therefore, signal interference may be prevented between the first and second sub-chips CH1 and CH2. In addition, because the upper and lower shield structures SU and SB are supplied with the same voltage, neither the upper shield structure SU nor the lower shield structure SB may be affected by variation in voltage therearound.

According to embodiments, on the optical black area OB, the upper shield structure SU may be supplied with voltage through the first upper wiring line 71 and the first upper conductive pad 61 that are located at the same level as that of the upper shield structure SU. The positions of the first upper wiring line 71 and the first upper conductive pad 61 may be freely adjusted on the optical black area OB.

Therefore, when the upper shield structure SU is applied with voltage, it may be possible to omit additional vias directly connected to the upper shield structure SU and to reduce the stacking number of the first vias 114. As a result, the first sub-chip CH1 may decrease in thickness and the number of process steps. These effects may also be applicable to the lower shield structure SB.

According to some embodiments, the upper shielding structure and the lower shielding structure may comprise dielectric material.

Figure 3G:
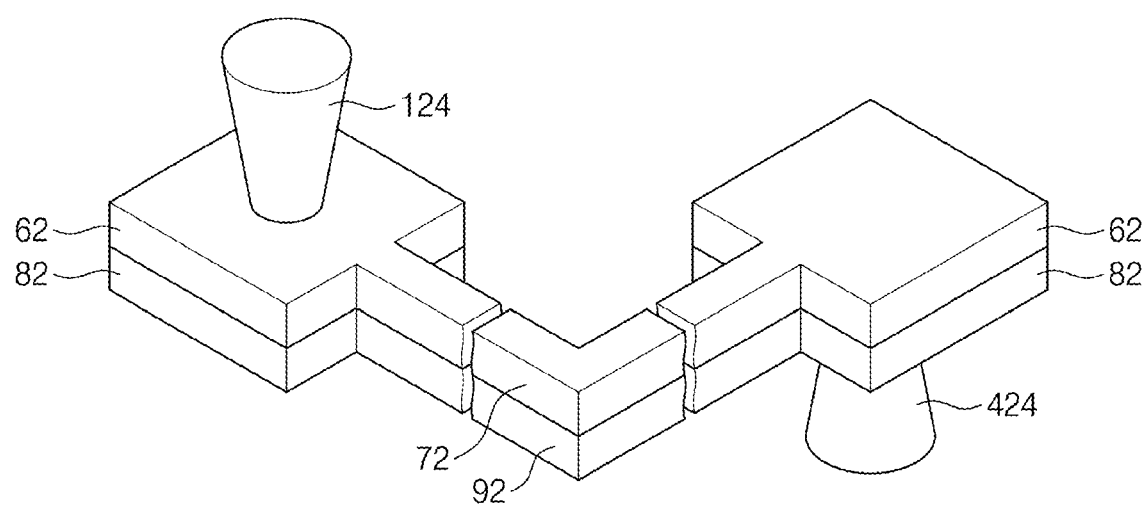
FIG. 3G illustrates a perspective view of a second lower conductive pad, a second upper conductive pad, a second lower wiring line, and a second upper wiring line of FIG. 3B.

FIG. 3G illustrates a perspective view showing the second upper conductive pad 62, the second lower conductive pad 82, the second upper wiring line 72, and the second lower wiring line 92 of FIG. 3B Referring to FIGS. 3B, 3C, and 3G, a pair of second upper conductive pads 62 may be integrally connected to each other through the second upper wiring line 72. The second upper conductive pads 62 may be electrically connected to the first wiring structure 112 through the first pad via 124 positioned on one of the pair of second upper conductive pads 62. The first wiring structure 112 may be connected to circuits in the pixel array area APS, and as a result, the second upper conductive pads 62 may be electrically connected to the circuits of the pixel array area APS.

A pair of second lower conductive pads 82 may be integrally connected to each other through the second lower wiring line 92. One of the pair of second lower conductive pads 82 may be provided thereon with the second pad via 424 that does not overlap the first pad via 124. The second lower conductive pads 82 may be electrically connected through the second pad via 424 to the second wiring structure 412. The second wiring structure 412 may be connected to the integrated circuit TR of the second substrate 400, and as a result, the second upper conductive pads 62 may be electrically connected to the integrated circuit TR.

According to embodiments, on the optical black area OB, the second upper conductive pads 62 may be connected to each other through the second upper wiring line 72, and the second lower conductive pads 82 may be connected to each other through the second lower wiring line 92, which may increase the degree of freedom of wiring design. Moreover, because the second upper wiring line 72 is located at the same level as that of the second upper conductive pads 62, and because the second lower wiring line 92 is located at the same level as that of the second lower conductive pads 82, it may be possible to reduce the stacking number of additional first wiring lines for connection with the second upper conductive pads 62 and the stacking number of additional second wiring lines for connection with the second lower conductive pads 82.

Furthermore, the second upper and lower wiring lines 72 and 92 may have their exposed surfaces whose most portions are in contact with each other, e.g., wide surfaces of the second upper and lower wiring lines 72 and 92 may be in contact with each other and completely overlap each other. Therefore, the second upper wiring line 72 may have no or little contact with the second dielectric layer 421, and the second lower wiring line 92 may have no or little contact with the first dielectric layer 121. Thus, an increased adhesive force may be provided between the upper bonding layer 120 and the lower bonding layer 420.

According to embodiments, a single or double damascene process may be used to form the first and second upper conductive pads 61 and 62, the first and second upper wiring lines 71 and 72, and the upper shield structures SU. Likewise, a single or double damascene process may be used to form the first and second lower conductive pads 81 and 82, the first and second lower wiring lines 91 and 92, and the lower shield structures SB.

As a result, the first and second upper conductive pads 61 and 62, the first and second upper wiring lines 71 and 72, and the upper shield structure SU may have their exposed surfaces (corresponding to their bottom surfaces depicted in FIG. 3C) that are exposed from the first dielectric layer 121 and are located at substantially the same level. In addition, the first and second lower conductive pads 81 and 82, the first and second lower wiring lines 91 and 92, and the lower shield structure SB may have their exposed surfaces (corresponding to their top surfaces depicted in FIG. 3C) that are exposed from the second dielectric layer 421 and are located at substantially the same level.

Figure 4A:
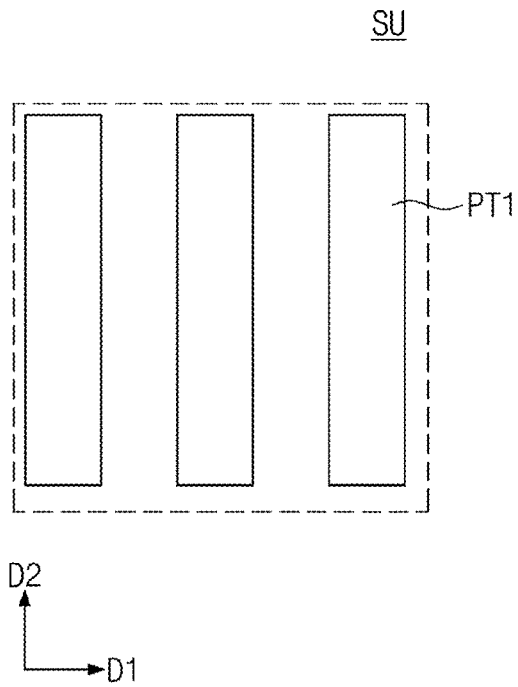
FIGS. 4A, 4B, and 4C illustrate simplified plan views respectively showing an upper shield structure, a lower shield structure, and a hybrid shield structure according to some embodiments.
Figure 4B:
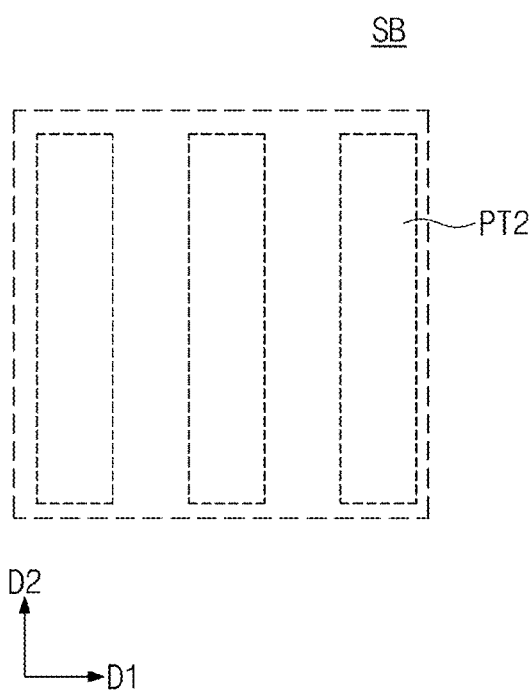
Figure 4C:
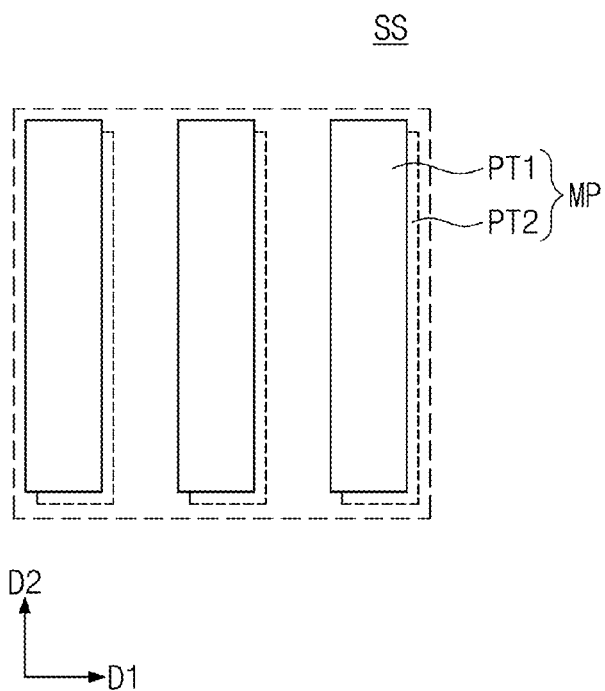

FIGS. 4A, 4B, and 4C illustrate simplified plan views respectively showing an upper shield structure, a lower shield structure, and a hybrid shield structure according to some embodiments. Omission will be made to avoid repetitive descriptions relative to FIGS. 3C to 3F.

Referring to FIG. 4A, the upper shield structure SU may include line-shaped first patterns PT1 that extend in the second direction D2. The first patterns PT1 may be spaced apart from each other along the first direction D1.

Referring to FIG. 4B, the lower shield structure SB may include line-shaped second patterns PT2 that extend in the second direction D2. The second patterns PT2 may be spaced apart from each other along the first direction D1.

Referring to FIG. 4C, the hybrid shield structure SS may include hybrid patterns MP including the upper shield structure SU and the lower shield structure SB that substantially completely overlap each other. For example, the hybrid shield structure SS may include a plurality of hybrid patterns MP, and each of the hybrid patterns MP may include the line-shaped first pattern PT1 and the line-shaped second pattern PT2 that substantially completely overlap each other. As shown in FIG. 4C, when the hybrid patterns each including the first pattern PT1 and the second pattern PT2 that overlap each other are spaced apart from each other without being in contact with each other, each of the hybrid patterns MP may be connected to the first upper wiring line 71 and the first lower wiring line 91 of FIGS. 3B and 3C. Alternatively, a conductive connection member may be separately provided to connect the hybrid patterns MP to each other, and the first upper wiring line 71 and the first lower wiring line 91 may be connected to at least one of the hybrid patterns MP.

Figure 5A:
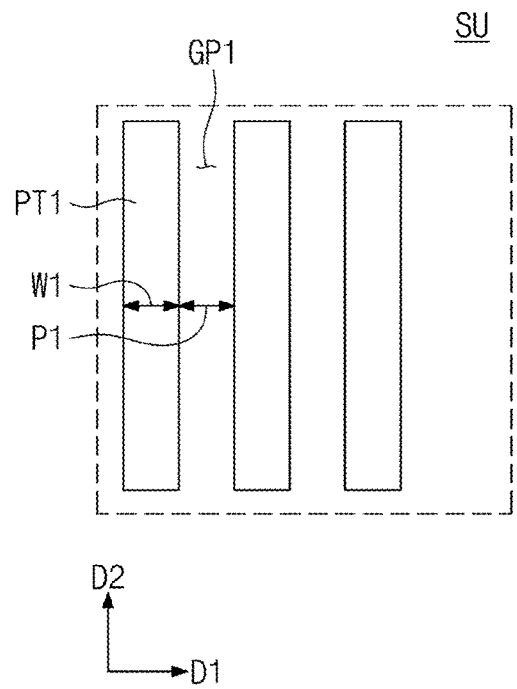
FIGS. 5A, 5B, and 5C illustrate simplified plan views respectively showing an upper shield structure, a lower shield structure, and a hybrid shield structure according to some embodiments.
Figure 5B:
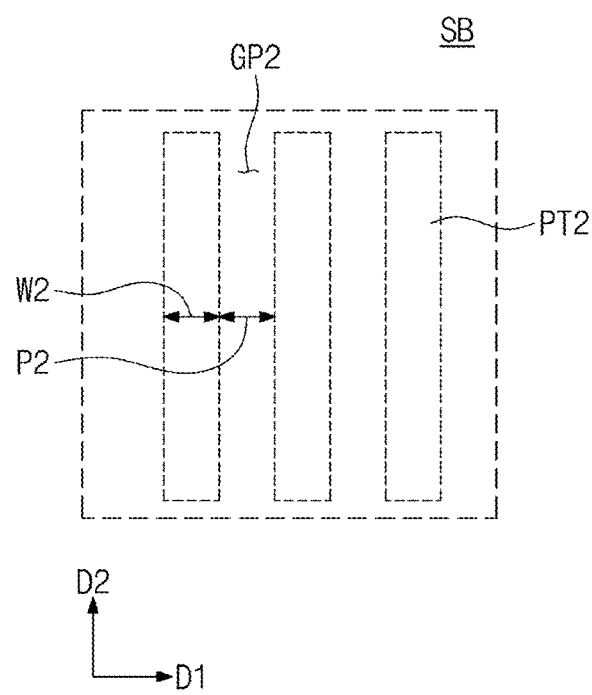
Figure 5C:
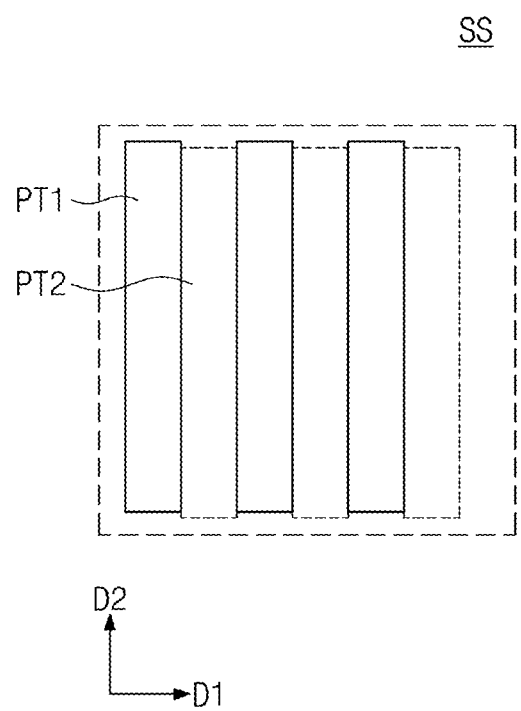

FIGS. 5A, 5B, and 5C illustrate simplified plan views respectively showing an upper shield structure, a lower shield structure, and a hybrid shield structure according to some embodiments. Omission will be made to avoid repetitive descriptions relative to FIGS. 3C to 3F.

Referring to FIGS. 5A and 5B, the upper shield structure SU may include line-shaped first patterns PT1 that extend in the second direction D2, and the first patterns PT1 may be spaced apart from each other along the first direction D1. The lower shield structure SB may include line-shaped second patterns PT2 that extend in the second direction D2, and the second patterns PT2 may be spaced apart from each other along the first direction D1. A first gap GP1 may be present between the first patterns PT1, and a second gap GP2 may be present between the second patterns PT2.

Each of the first patterns PT1 may have a first width W1 in the first direction D1, and the first gaps GP1 may have a first pitch P1 in the first direction D1. The first pitch P1 may correspond to an interval between the first patterns PT1. Each of the second patterns PT2 may have a second width W2 in the first direction D1, and the second gaps GP2 may have a second pitch P2 in the first direction D1. The second pitch P2 may correspond to an interval between the second patterns PT2.

Referring to FIG. 5C, the first patterns PT1 may not overlap the second patterns PT2. When viewed in a plan view, the first patterns PT1 may be provided on positions of the second gaps GP2, and the second patterns PT2 may be provided on positions of the first gaps GP1. For example, when viewed in a plan view, the first patterns PT1 and the second patterns PT2 may be disposed alternately. The first pitch P1 may be substantially the same as the second width W2, and the second pitch P2 may be substantially the same as the first width W1.

Figure 6A:
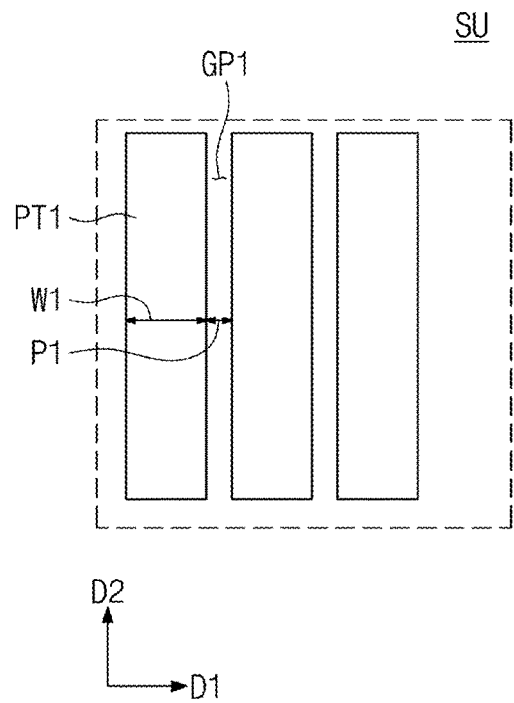
FIGS. 6A, 6B, and 6C illustrate simplified plan views respectively showing an upper shield structure, a lower shield structure, and a hybrid shield structure according to some embodiments.
Figure 6B:
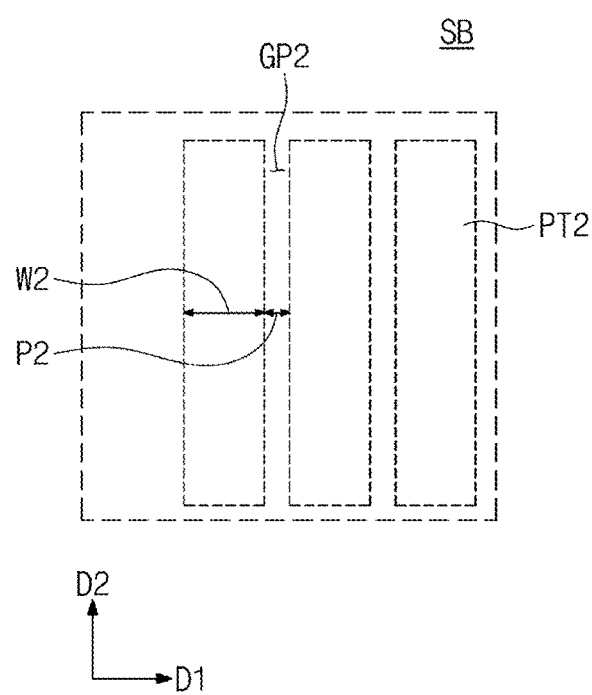
Figure 6C:
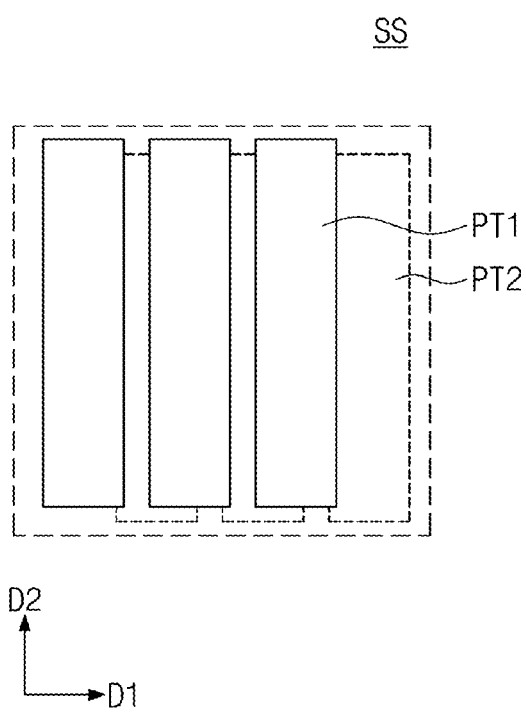

FIGS. 6A, 6B, and 6C illustrate simplified plan views respectively showing an upper shield structure, a lower shield structure, and a hybrid shield structure according to some embodiments. Omission will be made to avoid repetitive descriptions relative to FIGS. 3C to 3F.

Referring to FIGS. 6A and 6B, the upper shield structure SU may include line-shaped first patterns PT1 each of which extends in the second direction D2 and has a first width W1 in the first direction D1, and the first patterns PT1 may be spaced apart from each other along the first direction D1. The lower shield structure SB may include line-shaped second patterns PT2 each of which extends in the second direction D2 and has a second with W2 in the first direction D1, and the second patterns PT2 may be spaced apart from each other along the first direction D1. A first gap GP1 may be present between the first patterns PT1, and a second gap GP2 may be present between the second patterns PT2.

Referring to FIG. 6C, when viewed in a plan view, the first patterns PT1 may be provided on positions of the second gaps GP2, and the second patterns PT2 may be provided on positions of the first gaps GP1. A first pitch P1 of the first gaps GP1 may be less than the second width W2, and a second pitch P2 of the second gaps GP2 may be less than the first width W1. Therefore, when viewed in a plan view, the first patterns PT1 and the second patterns PT2 may partially overlap each other.

Figure 7A:
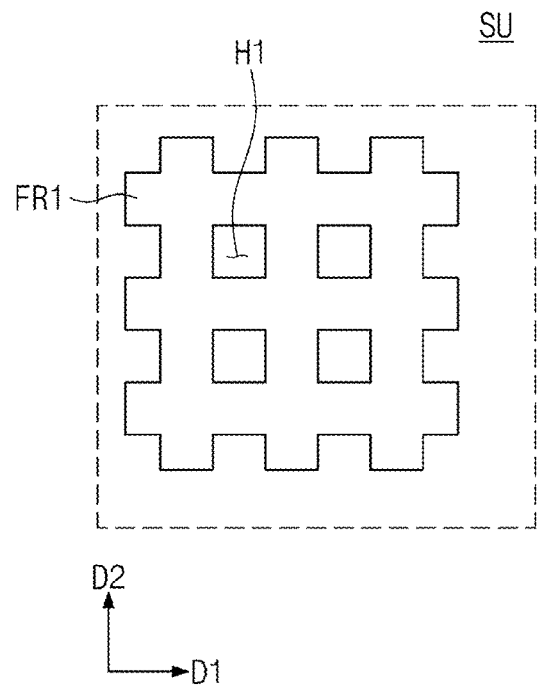
FIGS. 7A, 7B, and 7C illustrate simplified plan views respectively showing an upper shield structure, a lower shield structure, and a hybrid shield structure according to some embodiments.
Figure 7B:
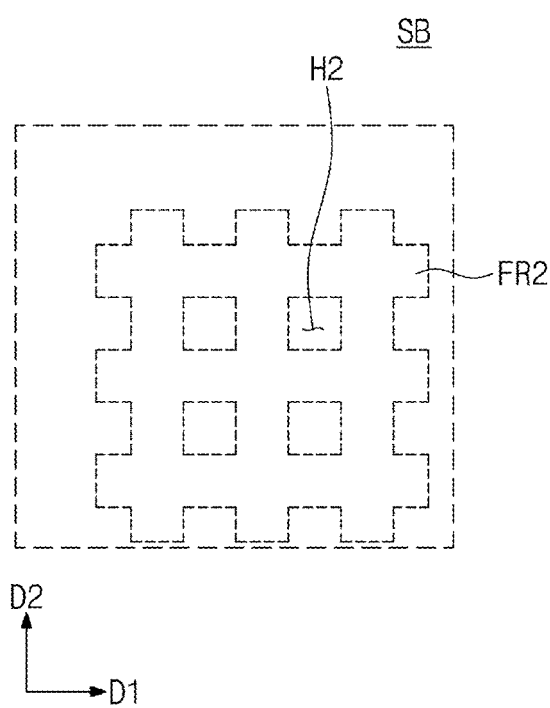
Figure 7C:
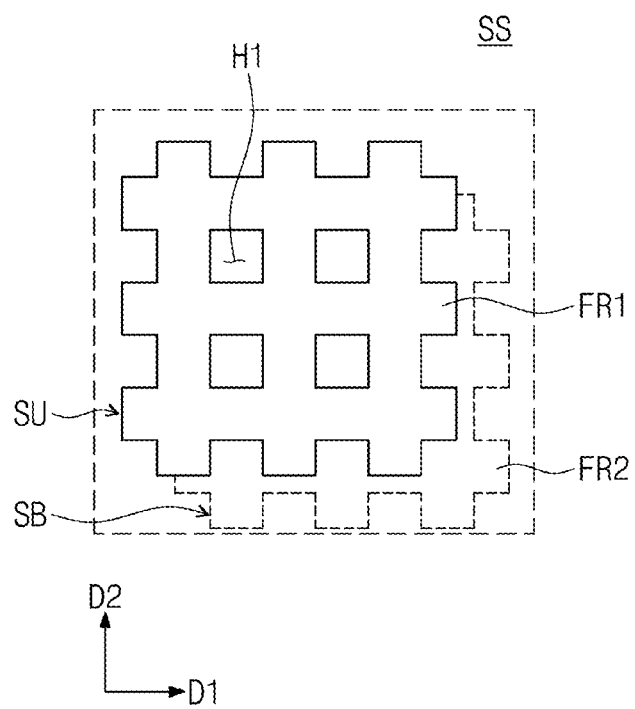

FIGS. 7A, 7B, and 7C illustrate simplified plan views respectively showing an upper shield structure, a lower shield structure, and a hybrid shield structure according to some embodiments. Omission will be made to avoid repetitive descriptions relative to FIGS. 3C to 3F.

Referring to FIG. 7A, the upper shield structure SU may include a lattice-shaped first frame FR1. The first frame FR1 may define a plurality of first holes H1.

Referring to FIG. 7B, the lower shield structure SB may include a lattice-shaped second frame FR2. The second frame FR2 may define a plurality of second holes H2.

Referring to FIG. 7C, when viewed in a plan view, the first frame FR1 may overlap the second frame FR2. The second holes H2 may not be exposed by the first frame FR1. A portion of the second frame FR2 may overlap the first frame FR1 and may not be exposed. A portion of the second frame FR2 may overlap the first holes H1, and the first holes H1 may expose the portion of the second frame FR2.

Figure 8A:
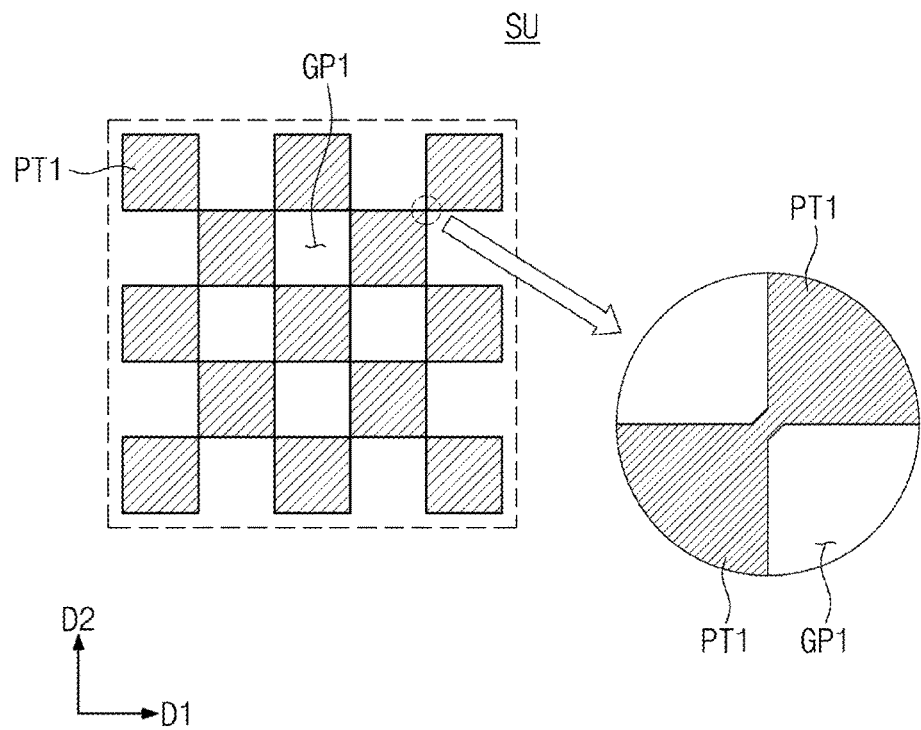
FIGS. 8A, 8B, and 8C illustrate simplified plan views respectively showing an upper shield structure, a lower shield structure, and a hybrid shield structure according to some embodiments.
Figure 8B:
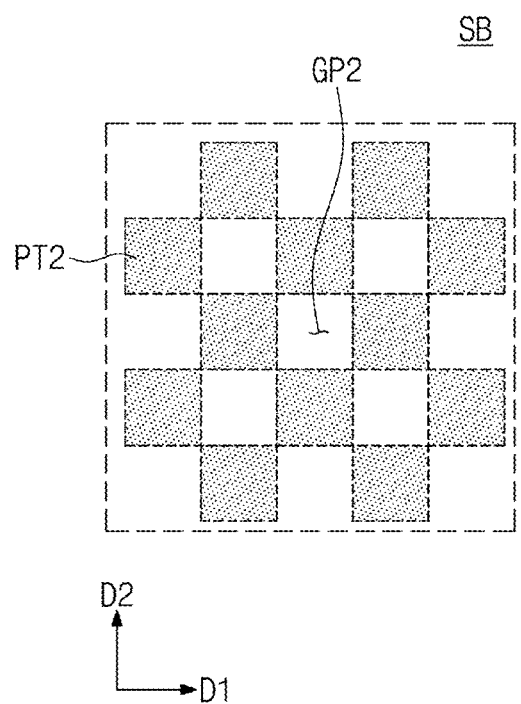
Figure 8C:
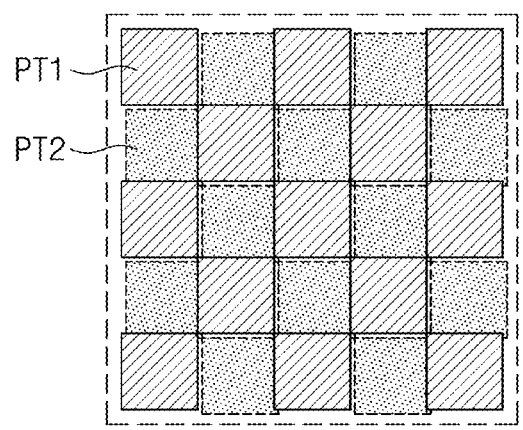

FIGS. 8A, 8B, and 8C illustrate simplified plan views respectively showing an upper shield structure, a lower shield structure, and a hybrid shield structure according to some embodiments. Omission will be made to avoid repetitive descriptions relative to FIGS. 3C to 3F.

Referring to FIGS. 8A and 8B, the upper shield structure SU and the lower shield structure SB may respectively include first patterns PT1 and second patterns PT2, and the first and second patterns PT1 and PT2 may be arranged in a zigzag fashion along the first and second directions D1 and D2. For example, the first patterns PT1 may be spaced apart from each other along the first direction D1 and along the second direction D2. A first gap GP1 may be present between the first patterns PT1. For example, the second patterns PT2 may be spaced apart from each other along the first direction D1 and along the second direction D2. A second gap GP2 may be present between the second patterns PT2. The first patterns PT1 may be integrally connected to each other along a diagonal direction between the first and second directions D1 and D2, and likewise the second patterns PT2 may be integrally connected to each other along a diagonal direction between the first and second directions D1 and D2.

Referring to FIG. 8C, the first patterns PT1 may correspondingly overlap the second gaps GP2, and the second patterns PT2 may correspondingly overlap the first gaps GP1.

By way of summation and review, some example embodiments provide an image sensor that effectively removes signal interference between a sensor chip and a logic chip. That is, according to some embodiments, an image sensor may include a sensor chip and a logic chip that are bonded to each other by coupling between upper conductive pads of the sensor chip and lower conductive pads of the logic chip. An upper shield structure and an upper wiring line may be provided at the same level as that of the upper conductive pads, and a lower shield structure and a lower wiring line may be provided at the same level as that of the lower conductive pads. Because the conductive pads, the shield structure, and the wiring line are located at the same level, it may be possible to reduce the number of additional wiring layers and to facilitate fabrication processes. In addition, the upper shield structure and the lower shield structure may be supplied with the same voltage, and thus, signal interference may be effectively prevented between the sensor chip and the logic chip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
    a logic chip, the logic chip including:
        a lower substrate,
        a lower bonding layer on the lower substrate, and
        a lower wiring layer between the lower substrate and the lower bonding layer, the lower bonding layer including:
            a lower dielectric layer,
            a lower conductive pad and a lower shield structure, each of which penetrates the lower dielectric layer, the lower conductive pad and the lower shield structure being spaced apart from each other, and
            a lower wiring line which penetrates the lower dielectric layer and electrically connects the lower conductive pad to the lower shield structure, wherein the lower wiring line, the lower conductive pad, and the lower shield structure are integrally formed into a first single body; and
    a sensor chip stacked on the logic chip, the sensor chip including:
        an upper substrate,
        an upper bonding layer below the upper substrate, the upper bonding layer and the lower bonding layer being in contact with each other, and the upper bonding layer including:
            an upper dielectric layer,
            an upper conductive pad and an upper shield structure, each of which penetrates the upper dielectric layer, the upper conductive pad and the upper shield structure being spaced apart from each other, and
            an upper wiring line which penetrates the upper dielectric layer and electrically connects the upper conductive pad to the upper shield structure, wherein the upper wiring line, the upper conductive pad, and the upper shield structure are integrally formed into a second single body, and
        an upper wiring layer between the upper substrate and the upper bonding layer,
    wherein the upper conductive pad and the lower conductive pad overlap and contact each other, and the upper wiring line and the lower wiring line overlap and contact each other.

2. The image sensor as claimed in claim 1, wherein:
    the upper substrate includes a pixel array area, and an optical black area surrounding the pixel array area,
    the upper shield structure and the lower shield structure overlap the pixel array area, and
    the upper conductive pad, the upper wiring line, the lower conductive pad, and the lower wiring line overlap the optical black area.

3. The image sensor as claimed in claim 1, wherein the upper shield structure and the lower shield structure are in contact with each other.

4. The image sensor as claimed in claim 1, wherein the upper conductive pad, the upper wiring line, the lower conductive pad, and the lower wiring line comprise conductive material, and wherein the upper shield structure and the lower shield structure comprise dielectric material.

5. The image sensor as claimed in claim 1, wherein:
    the upper shield structure includes first patterns spaced apart from each other along a first direction parallel to a top surface of the upper substrate, each of the first patterns having a linear shape along a second direction parallel to the top surface of the upper substrate and intersecting the first direction,
    the lower shield structure includes second patterns spaced apart from each other along the second direction, each of the second patterns having a linear shape along the first direction, and
    the first patterns and the second patterns intersect each other to form a lattice shape when viewed in a plan view.

6. The image sensor as claimed in claim 1, wherein:
    the upper shield structure includes first patterns spaced apart from each other along a first direction parallel to a top surface of the upper substrate,
    the lower shield structure includes second patterns spaced apart from each other along the first direction, and
    each of the first patterns and the second patterns has a linear shape along a second direction parallel to the top surface of the upper substrate, the second direction intersecting the first direction.

7. The image sensor as claimed in claim 6, wherein:
    the upper shield structure has first gaps between the first patterns,
    the lower shield structure has second gaps between the second patterns,
    when viewed in a plan view, the first patterns overlap corresponding second gaps, and
    when viewed in the plan view, the second patterns overlap corresponding ones of the first gaps.

8. The image sensor as claimed in claim 7, wherein:
    the first patterns have a first width in the first direction,
    the second patterns have a second width in the first direction,
    a first interval between the first patterns is less than the second width, and
    a second interval between the second patterns is less than the first width.

9. The image sensor as claimed in claim 7, wherein:
    the first patterns have a first width in the first direction,
    the second patterns have a second width in the first direction,
    a first interval between the first patterns is substantially the same as the second width, and
    a second interval between the second patterns is substantially the same as the first width.

10. The image sensor as claimed in claim 1, wherein:
    the upper shield structure includes a lattice-shaped first frame with first holes defined by the first frame,
    the lower shield structure includes a lattice-shaped second frame with second holes defined by the second frame,
    the lattice-shaped first frame overlaps the second holes, and
    the lattice-shaped second frame overlaps the first holes.

11. The image sensor as claimed in claim 1, wherein:
the upper shield structure includes first patterns arranged in a zigzag pattern along a first direction and a second direction, the first and second directions being parallel to a top surface of the upper substrate, and the second direction intersecting the first direction,
the lower shield structure includes second patterns arranged in a zigzag pattern along the first direction and the second direction,
the upper shield structure has first gaps between the first patterns,
the lower shield structure has second gaps between the second patterns,
the first patterns overlap corresponding second gaps, and the second patterns overlap corresponding ones of the first gaps.

12. The image sensor as claimed in claim 1, wherein the upper conductive pad, the upper shield structure, the upper wiring line, the lower conductive pad, the lower shield structure, and the lower wiring line include copper.

13. The image sensor as claimed in claim 1, wherein:
the upper wiring layer includes a first via adjacent to the upper bonding layer,
the lower wiring layer includes a second via adjacent to the lower bonding layer,
the first via is selectively in contact with the upper conductive pad, and is in contact with neither the upper shield structure nor the upper wiring line, and
the second via is selectively in contact with the lower conductive pad, and is in contact with neither the lower shield structure nor the lower wiring line.

14. An image sensor, comprising a logic chip and a sensor chip which are sequentially stacked, wherein:
the sensor chip includes a first substrate, an upper bonding layer below the first substrate, and a first wiring layer between the first substrate and the upper bonding layer,
the logic chip includes a second substrate, a lower bonding layer on the second substrate, and a second wiring layer between the second substrate and the lower bonding layer,
the upper bonding layer and the lower bonding layer are in contact with each other,
the upper bonding layer includes an upper dielectric layer, a pair of upper conductive pads, an upper shield structure, and an upper wiring line, the pair of upper conductive pads, the upper shield structure, and the upper wiring line penetrating the upper dielectric layer,
the lower bonding layer includes a lower dielectric layer, a pair of lower conductive pads, a lower shield structure, and a lower wiring line, the pair of lower conductive pads, the lower shield structure, and the lower wiring line penetrating the lower dielectric layer,
the upper wiring line is between and integrally connects the pair of upper conductive pads, and the upper wiring line and the pair of upper conductive pads are integrally formed into a first single body,
the lower wiring line is between and integrally connects the pair of lower conductive pads, and the lower wiring line and the pair of lower conductive pads are integrally formed into a second single body,
the first substrate includes a pixel array area and an optical black area surrounding the pixel array area, the upper shield structure and the lower shield structure overlapping the pixel array area,
the pair of upper conductive pads, the upper wiring line, the pair of lower conductive pads, the lower shield structure, and the lower wiring line overlap the optical black area,
each of the pair of upper conductive pads overlaps and contacts a corresponding one of the pair of lower conductive pads, and
the upper wiring line overlaps and contacts the lower wiring line.

15. The image sensor as claimed in claim 14, wherein:
the first wiring layer includes a first via adjacent to the upper bonding layer,
the second wiring layer includes a second via adjacent to the lower bonding layer,
the pair of upper conductive pads include a first upper conductive pad and a second upper conductive pad,
the pair of lower conductive pads include a first lower conductive pad and a second lower conductive pad,
one surface of the first upper conductive pad is in contact with one surface of the first lower conductive pad,
one surface of the second upper conductive pad is in contact with one surface of the second lower conductive pad,
the first via is selectively in contact with another surface of the first upper conductive pad, and
the second via is selectively in contact with another surface of the second lower conductive pad.

16. The image sensor as claimed in claim 14, wherein the pair of upper conductive pads, the upper shield structure, the upper wiring line, the pair of lower conductive pads, the lower shield structure, and the lower wiring line include copper.

17. An image sensor, comprising a logic chip and a sensor chip which are sequentially stacked, wherein:
the sensor chip includes a first substrate, an upper bonding layer below the first substrate, a first wiring layer between the first substrate and the upper bonding layer, a connection structure which penetrates the first substrate and penetrates at least a portion of the first wiring layer, and an external coupling pad on the connection structure,
the logic chip includes a second substrate, a lower bonding layer on the second substrate, and a second wiring layer between the second substrate and the lower bonding layer,
the first wiring layer includes an interlayer dielectric layer and a wiring structure in the interlayer dielectric layer, the wiring structure being in contact with the connection structure,
the upper bonding layer and the lower bonding layer are in contact with each other,
the upper bonding layer includes an upper dielectric layer, and also includes a first upper conductive pad, a pair of second upper conductive pads, an upper shield structure, a first upper wiring line, and a second upper wiring line each of which penetrates the upper dielectric layer,
the lower bonding layer includes a lower dielectric layer, and also includes a first lower conductive pad, a pair of second lower conductive pads, a lower shield structure, a first lower wiring line, and a second lower wiring line each of which penetrates the lower dielectric layer,
the first upper wiring line is between and integrally connects the first upper conductive pad and the upper shield structure, and the first upper wiring line, the first upper conductive pad, and the upper shield structure are integrally formed into a first single body, the second upper wiring line is between and integrally connects the pair of second upper conductive pads, the first lower wiring line is between and integrally connects the first lower conductive pad and the lower shield structure, and the first lower wiring line, the first lower conductive pad, and the lower shield structure are integrally formed into a second single body, the second lower wiring line is between and integrally connects the pair of second lower conductive pads, the wiring structure is in contact with the first upper conductive pad, the first upper conductive pad and the first lower conductive pad overlap and contact each other, the pair of second upper conductive pads and the pair of second lower conductive pads correspondingly overlap and contact each other, the first upper wiring line and the first lower wiring line overlap and contact each other, the second upper wiring line and the second lower wiring line overlap and contact each other, and the upper shield structure and the lower shield structure are in contact with each other.

18. The image sensor as claimed in claim 17, wherein:

the first substrate includes a pixel array area and an optical black area which surrounds the pixel array area, the upper shield structure and the lower shield structure overlap the pixel array area, and the first and second upper conductive pads, the first and second upper wiring lines, the first and second lower conductive pads, and the first and second lower wiring lines overlap the optical black area.

19. The image sensor as claimed in claim 17, wherein:

the upper shield structure includes first patterns which are spaced apart from each other along a first direction parallel to a top surface of the first substrate, the lower shield structure includes second patterns which are spaced apart from each other along a second direction parallel to the top surface of the first substrate, the second direction intersecting the first direction, each of the first patterns extends along the second direction, each of the second patterns extends along the first direction, and the first patterns and the second patterns intersect each other to form a lattice shape when viewed in a plan view.

20. The image sensor as claimed in claim 17, wherein the upper shield structure and the lower shield structure are configured to receive a same voltage.

* * * * *